(12) United States Patent
Song (10) Patent No.: US 10,720,439 B2
(45) Date of Patent: Jul. 21, 2020

(54) NONVOLATILE MEMORY DEVICE AND METHOD FOR MANUFACTURING THE SAME

(71) Applicants: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

(72) Inventor: Changgeng Song, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 0 days.

(21) Appl. No.: 15/404,005

(22) Filed: Jan. 11, 2017

(65) Prior Publication Data

US 2017/0221914 A1 Aug. 3, 2017

(30) Foreign Application Priority Data

Feb. 2, 2016 (CN) .......................... 2016 1 0073071

(51) Int. Cl.
*H01L 27/11573* (2017.01)
*H01L 27/11543* (2017.01)
(Continued)

(52) U.S. Cl.
CPC ...... *H01L 27/11543* (2013.01); *H01L 21/764* (2013.01); *H01L 27/11521* (2013.01);
(Continued)

(58) Field of Classification Search
CPC ......... H01L 27/11543; H01L 27/11573; H01L 29/0657; H01L 21/28273; H01L 27/11568;
(Continued)

(56) References Cited

U.S. PATENT DOCUMENTS 6,255,187 B1 * 7/2001 Horii .................... H01L 21/2885
257/E21.009
7,835,179 B1 * 11/2010 Prabhakar ............. G11C 11/005
365/185.05
(Continued)

FOREIGN PATENT DOCUMENTS

CN 104541370 4/2015

OTHER PUBLICATIONS

European Application No. 17152661.9, Partial European Search Report dated Jun. 14, 2017, 17 pages.
(Continued)

*Primary Examiner* — David Vu
(74) *Attorney, Agent, or Firm* — Kilpatrick Townsend & Stockton LLP (57) ABSTRACT

A method for manufacturing a semiconductor device includes providing a substrate structure having an active region, a gate insulating layer, a charge storage layer, a gate dielectric layer, and a gate layer sequentially formed on the active region. The method also includes forming a patterned metal layer on the substrate structure, removing a respective portion of the gate layer, the gate dielectric layer, the charge storage layer using the patterned metal gate layer as a mask to form multiple gate structures separated from each other
(Continued)

by a space. The gate structures each include a stack containing a second portion of the charge storage layer, the gate dielectric layer, the gate layer, and one of the gate lines. The method further includes forming an interlayer dielectric layer on a surface of the gate structures stretching over the space while forming an air gap in the space.

10 Claims, 8 Drawing Sheets

(51) Int. Cl.
| | |
|---|---|
| H01L 21/28 | (2006.01) |
| H01L 21/764 | (2006.01) |
| H01L 27/11539 | (2017.01) |
| H01L 27/11529 | (2017.01) |
| H01L 27/11536 | (2017.01) |
| H01L 27/11524 | (2017.01) |
| H01L 27/11541 | (2017.01) |
| H01L 29/423 | (2006.01) |
| H01L 27/11521 | (2017.01) |
| H01L 27/11568 | (2017.01) |
| H01L 29/06 | (2006.01) |
| H01L 29/49 | (2006.01) |
| H01L 27/1157 | (2017.01) |

(52) U.S. Cl.
CPC .. *H01L 27/11524* (2013.01); *H01L 27/11529* (2013.01); *H01L 27/11536* (2013.01); *H01L 27/11539* (2013.01); *H01L 27/11541* (2013.01); *H01L 27/11568* (2013.01); *H01L 27/11573* (2013.01); *H01L 29/0657* (2013.01); *H01L 29/40114* (2019.08); *H01L 29/40117* (2019.08); *H01L 29/42324* (2013.01); *H01L 29/4991* (2013.01); *H01L 27/1157* (2013.01); *H01L 29/4234* (2013.01)

(58) Field of Classification Search
CPC ........... H01L 27/11521; H01L 29/4991; H01L 21/28282
See application file for complete search history.

(56) References Cited

U.S. PATENT DOCUMENTS

| | | | |
|---|---|---|---|
| 9,070,746 B2* | 6/2015 | Kuge | ................ H01L 27/11524 |
| 2011/0309426 A1 | 12/2011 | Purayath et al. | |
| 2012/0064707 A1 | 3/2012 | Yang et al. | |
| 2012/0178235 A1 | 7/2012 | Pachamuthu et al. | |
| 2012/0256263 A1* | 10/2012 | Inoue | ................... H01L 21/764 |
| | | | 257/368 |
| 2012/0326225 A1* | 12/2012 | Chang | ................... H01L 29/792 |
| | | | 257/326 |
| 2013/0248963 A1* | 9/2013 | Takekida | ............ H01L 27/1052 |
| | | | 257/315 |
| 2015/0028409 A1 | 1/2015 | Kuge | |

OTHER PUBLICATIONS

European Application No. 17152661.9, Extended European Search Report dated Sep. 28, 2017, 15 pages.
Chinese Patent Application No. 201610073071.3, Office Action dated Mar. 20, 2019, 12 pages.

* cited by examiner

NONVOLATILE MEMORY DEVICE AND
METHOD FOR MANUFACTURING THE
SAME

CROSS-REFERENCES TO RELATED
APPLICATIONS

This application claims priority to Chinese patent application No. 201610073071.3, filed on Feb. 2, 2016, the content of which is incorporated herein by reference in its entirety.

BACKGROUND OF THE INVENTION

Embodiments of the disclosure relate to the field of semiconductor device fabrication. In particular, embodiments of the disclosure relate to a flash memory device and method of manufacturing the same.

With the continuous development of semiconductor technology, the feature sizes of semiconductor devices continue to decrease. However, in a memory device, such as a NAND-type nonvolatile memory device, the capacitance between gate lines (i.e., word lines) greatly affect the performance of the memory device. A conventional semiconductor manufacturing process utilizes an interlayer dielectric layer to isolate the gate lines. However, such approach results in higher capacitance between the gates, thereby affecting the performance of the device.

Thus, there is a need for a novel semiconductor structure and manufacturing method for reducing capacitance between gate lines.

BRIEF SUMMARY OF THE INVENTION

The present inventor proposes the following method and structure for solving the problems of high capacitance value between gate lines.

Embodiments of the present invention overcome the aforementioned deficiencies by provide a novel method for manufacturing a semiconductor device.

According to some embodiments of the present invention, a method for manufacturing a semiconductor device includes providing a substrate structure. The substrate structure includes a semiconductor substrate comprising an active region extending along a first direction and an isolation region adjacent the active region, a gate insulating layer on the active region, a charge storage layer on the gate insulating layer, a gate dielectric layer on the charge storage layer, and a gate layer on the gate dielectric layer. The method also includes forming a patterned metal gate layer on the substrate structure. The patterned metal gate layer includes a plurality of gate lines extending along a second direction different from the first direction and separated from each other in the first direction. The method further includes removing by etching a first portion of the gate layer, a first portion of the gate dielectric layer, a first portion of the charge storage layer using the patterned metal gate layer as a mask to form a plurality of gate structures that are separated from each other in the first direction by a space, each of the gate structures comprising a gate stack including a second portion of the charge storage layer, a second portion of the gate dielectric layer over the second portion of the charge storage layer, a second portion of the gate layer over the second portion of the gate dielectric layer, and a portion of one of the gate lines over the second portion of the gate layer. In addition, the method includes forming an interlayer dielectric layer on an upper surface of the gate structures stretching over the space while forming an air gap in the space.

In one embodiment, forming the interlayer dielectric layer comprises a plasma-enhanced chemical vapor deposition (PECVD) process.

In one embodiment, the active region includes a plurality of fins extending along the first direction, and the isolation region is a trench isolation region. In one embodiment, the isolation region has an upper surface lower than an upper surface of the active region forming a trench, the gate dielectric layer is formed on a bottom and sidewalls of the trench.

In one embodiment, the method further includes forming the gate layer on the gate dielectric layer and filling the trench.

In one embodiment, the method further includes, prior to forming the patterned metal gate layer, forming an adhesive layer on the gate layer to improve a bond between the patterned metal gate layer and the gate layer. The patterned metal layer comprises one or more of tungsten, titanium, nickel, palladium, platinum, rhodium, thallium, an alloy thereof, or a metal silicide thereof.

In one embodiment, the active region also includes a peripheral region, and the method further includes forming an opening extending through the gate layer, the gate dielectric layer, and into a portion of the charge storage layer, wherein the patterned metal gate layer is in electrical contact with the gate layer and in electrical contact with the charge storage layer through the opening.

In one embodiment, forming the patterned metal gate layer includes forming a patterned hardmask layer on the gate layer, the patterned hard mask layer includes at least a pattern corresponding to the gate lines, forming a metal gate layer on the patterned hardmask layer, and planarizing the metal gate layer until an upper surface of the metal gate layer is flush with an upper surface of the patterned hardmask layer.

In one embodiment, the active region includes a peripheral region, and the method further includes forming an opening in the peripheral region extending through the second gate layer, the gate dielectric layer, and into a portion of the charge storage layer, wherein the patterned metal gate layer is in electrical contact with the second gate layer and in electrical contact with the charge storage layer through the opening, forming a patterned hardmask layer on the gate layer, the patterned hard mask layer including at least a pattern corresponding to the gate lines and exposing the opening, forming a metal gate layer on the patterned hardmask layer, and planarizing the metal gate layer until an upper surface of the metal gate layer is flush with an upper surface of the patterned hardmask layer.

In one embodiment, the active region further includes a peripheral region and a plurality of fins extending along the first direction; the isolation region is a trench isolation region, the method further includes forming an opening in the peripheral region through the gate layer, the gate dielectric layer, and into a portion of the charge storage layer, wherein the patterned metal gate layer is in electrical contact with the gate layer and in electrical contact with the charge storage layer through the opening, and wherein a peripheral device in the peripheral region and a corresponding memory cell in the active region are located in a same fin.

In one embodiment, the second portion of the charge storage layer is a floating gate, the second portion of the gate layer is a control gate, and the gate insulating layer below the floating gate is a tunnel insulating layer. Alternatively, the second portion of the charge storage layer includes a silicon oxide-silicon nitride-silicon oxide layer stack, the second portion of the gate layer and a corresponding gate line together form a control gate, and the gate insulating layer below the floating gate is a tunnel insulating layer.

Embodiments of the present invention also provide a semiconductor device. The semiconductor device may include a semiconductor substrate including an active region extending along a first direction and an adjacent isolation region, a gate insulating layer on the active region, a patterned metal gate layer comprising a plurality of metal gate lines extending along a second direction different from the first direction, a plurality of gate structures separated from each other by a space in the first direction, each of the gate structures comprising a charge storage unit on the gate insulating layer, a first portion of a gate dielectric layer on the charge storage unit, a first portion of a gate layer on the first portion of the gate dielectric layer, and a metal gate on the first portion of the gate layer, the metal gate being a portion of a corresponding metal gate line, and an interlayer dielectric layer on an upper surface of the gate structures stretching over the space while forming an air gap in the space.

In one embodiment, the interlayer dielectric layer has a thickness in a range between 50 nm and 800 nm. In one embodiment, the active region comprises a plurality of fins extending along the first direction, and the isolation region is a trench isolation region.

In one embodiment, the semiconductor device also includes an adhesive layer disposed between the patterned metal gate layer and the gate layer and configured to improve a bond between the patterned metal gate layer and the gate layer.

In one embodiment, the active region includes a plurality of fins extending along the first direction, the isolation region is a trench isolation region having an upper surface lower than an upper surface of the active region forming a trench, the gate dielectric layer is formed on a bottom and sidewalls of the trench, and the gate layer is disposed on the gate dielectric layer filling the trench.

In one embodiment, the patterned metal layer may include one or more of tungsten, titanium, nickel, palladium, platinum, rhodium, thallium, an alloy thereof, or a metal silicide thereof.

In one embodiment, the active region may further include a peripheral region comprising a peripheral device and an opening in the peripheral region and extending through the gate layer, the gate dielectric layer, and into a portion of the charge storage layer. The patterned metal gate layer is in electrical contact with the gate layer and in electrical contact with the charge storage layer through the opening.

In one embodiment, the active region may further include a plurality of fins extending along the first direction, the isolation region is a trench isolation region, and the peripheral device in the peripheral region and a corresponding memory cell in the active region are located in a same fin.

In one embodiment, the second portion of the charge storage layer is a floating gate, the second portion of the second gate layer is a control gate, the gate insulating layer below the floating gate is a tunnel insulating layer. In an alternative embodiment, the second portion of the charge storage layer comprises a silicon oxide-silicon nitride-silicon oxide layer stack, a portion of the gate layer and a corresponding gate line together form a control gate, and the gate insulating layer below the floating gate is a tunnel insulating layer.

The following description, together with the accompanying drawings, will provide a better understanding of the nature and advantages of the claimed invention.

BRIEF DESCRIPTION OF THE DRAWINGS

The accompanying drawings, referred to herein and constituting a part hereof, illustrate embodiments of the invention. The drawings together with the description serve to explain the principles of the invention.

DETAILED DESCRIPTION OF THE INVENTION

In the following description, numerous specific details are provided for a thorough understanding of the present invention. However, it should be appreciated by those of skill in the art that the present invention may be realized without one or more of these details. In other examples, features and techniques known in the art will not be described for purposes of brevity.

It should be understood that the drawings are not drawn to scale, and similar reference numbers are used for representing similar elements. Embodiments of the invention are described herein with reference to perspective cross-section illustrations that are schematic illustrations of idealized embodiments (and intermediate structures) of the invention. The thickness of layers and regions in the drawings may be exaggerated relative to each other for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

It will be understood that, when an element or layer is referred to as "on," "disposed on," "adjacent to," "connected to," or "coupled to" another element or layer, it can be disposed directly on the other element or layer, adjacent to, connected or coupled to the other element or layer, or intervening elements or layers may also be present. In contrast, when an element is referred to as being "directly on," directly disposed on," "directly connected to," or "directly coupled to" another element or layer, there are no intervening elements or layers present between them. It will be understood that, although the terms "first," "second," "third," etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Relative terms such as "higher", "lower", "under," "below," "underneath," "over," "on," "above," "bottom," and "top" are used herein to described a relationship of one element, layer or region to another element, layer or region as illustrated in the figures. It will be understood that these terms are intended to encompass different orientations of the structure in addition to the orientation depicted in the figures. For example, if the device shown in the figures is flipped (turned over), the description of an element being "below" or "underneath" another element would then be oriented as "above" the other element. Therefore, the term "below," "under," or "underneath" can encompass both orientations of the device. Because devices or components of embodiments of the present invention can be positioned in a number of different orientations (e.g., rotated 90 degrees or at other orientations), the relative terms should be interpreted accordingly.

The terms "a", "an" and "the" may include singular and plural references. It will be further understood that the terms "comprising", "including", "having" and variants thereof, when used in this specification, specify the presence of stated features, steps, operations, elements, and/or components, but do not preclude the presence or addition of one or more other features, steps, operations, elements, components, and/or groups thereof. Furthermore, as used herein, the words "and/or" may refer to and encompass any possible combinations of one or more of the associated listed items.

The use of the terms first, second, etc. do not denote any order, but rather the terms first, second, etc. are used to distinguish one element from another. Furthermore, the use of the terms a, an, etc. does not denote a limitation of quantity, but rather denote the presence of at least one of the referenced items.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

The term "substrate" may include any structure having an exposed surface with which to form an integrated circuit. The term "substrate" is understood to include semiconductor wafers and is also used to refer to semiconductor structures during processing and may include other layers that have been fabricated thereupon. A "substrate" may include doped and undoped semiconductor wafers, epitaxial semiconductor layers, as well as other semiconductor structures.

As described in the background section, the present inventor discovered that the coupling or fringe capacitance value between gate lines is large in a conventional semiconductor memory device. Therefore, the present inventor proposes following solutions: a method and semiconductor structure that can reduce the coupling or fringe capacitance value between gate lines.

Figure 1:
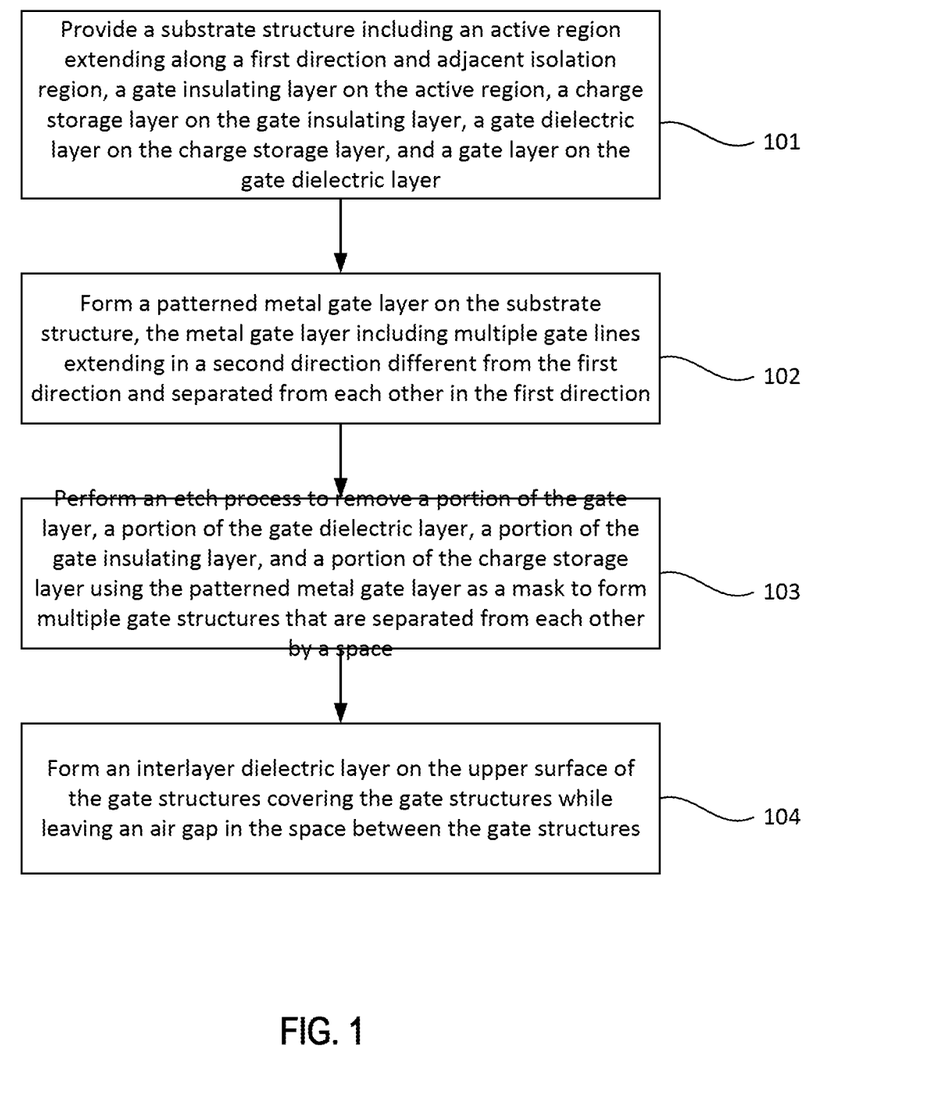
FIG. 1 is a flow chart of a method for manufacturing a semiconductor device according to some embodiments of the present invention.

Embodiments of the present invention will be described with reference to FIG. 1 and FIGS. 2 through 8. FIG. 1 is a flowchart illustrating a method for manufacturing a semiconductor device according to some embodiments of the present invention. FIGS. 2 through 8 are perspective cross-sectional views of intermediate stages in the manufacturing of a semiconductor device according to an embodiment of the present invention.

Referring to FIG. 1, a substrate structure is provided in block 101.

Figure 2:
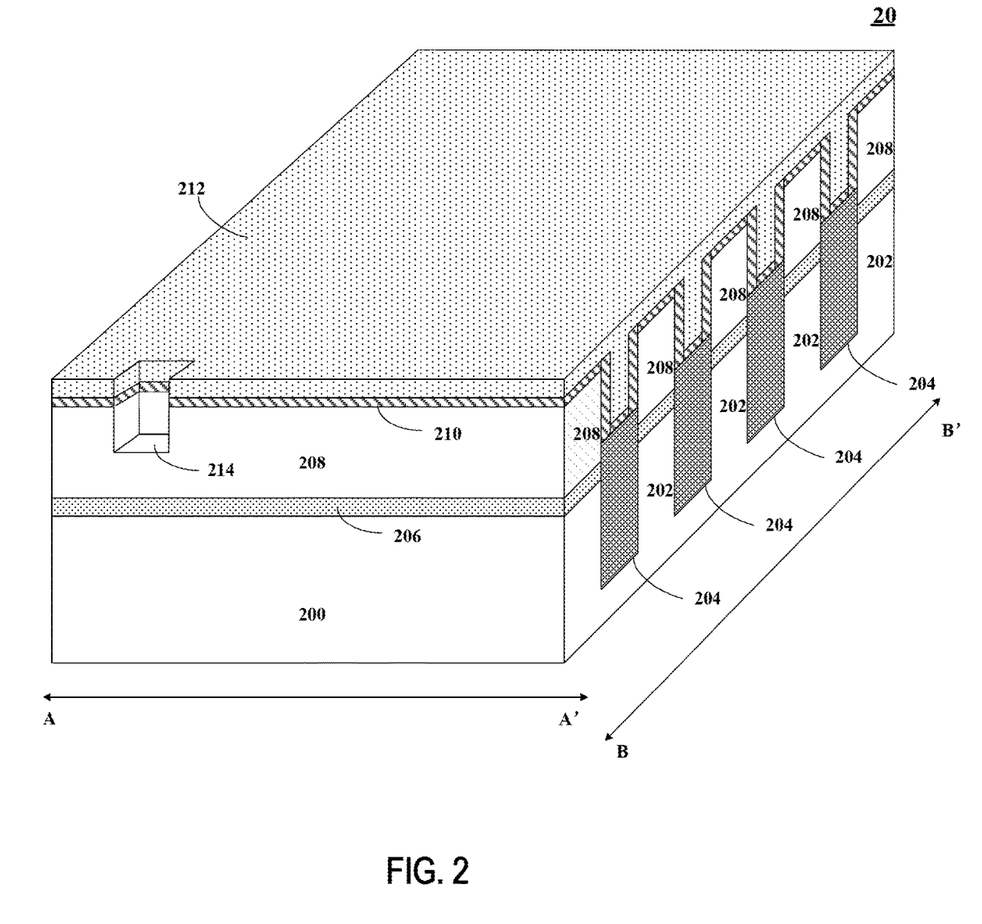
FIGS. 2 through 8 are perspective cross-sectional views of intermediate stages in the manufacturing of a semiconductor device according to some embodiments of the present invention.

As shown in FIG. 2, a substrate structure 20 may include a semiconductor substrate 200 having an active region 202 extending along a first direction (e.g., direction along the line AA'), and an isolation region 204 disposed adjacent to active region 202. Substrate structure 20 may further include a gate insulating layer 206 disposed on active region 202, a charge storage layer 208 disposed on gate insulating layer 206, a gate dielectric layer 210 disposed on charge storage layer 208, and a gate electrode layer (alternatively referred to herein as "gate layer") 212 disposed on gate dielectric layer 210.

Gate insulating layer 206 may be formed of silicon oxide. Charge storage layer 208 may be selected from various materials that can be used effectively to store charge, e.g., doped polysilicon (floating gate), silicon oxide-silicon nitride-silicon oxide (ONO) stacked layer structure, etc.

Gate dielectric layer 210 may be formed of silicon oxide, silicon nitride, or a stacked layer structure of silicon oxide and silicon nitride. Preferably, in the embodiment of a floating gate, gate dielectric layer 210 may be a silicon oxide-silicon nitride-silicon oxide (ONO) structure. Gate electrode layer 212 may be formed of a doped polysilicon material.

Figure 3:
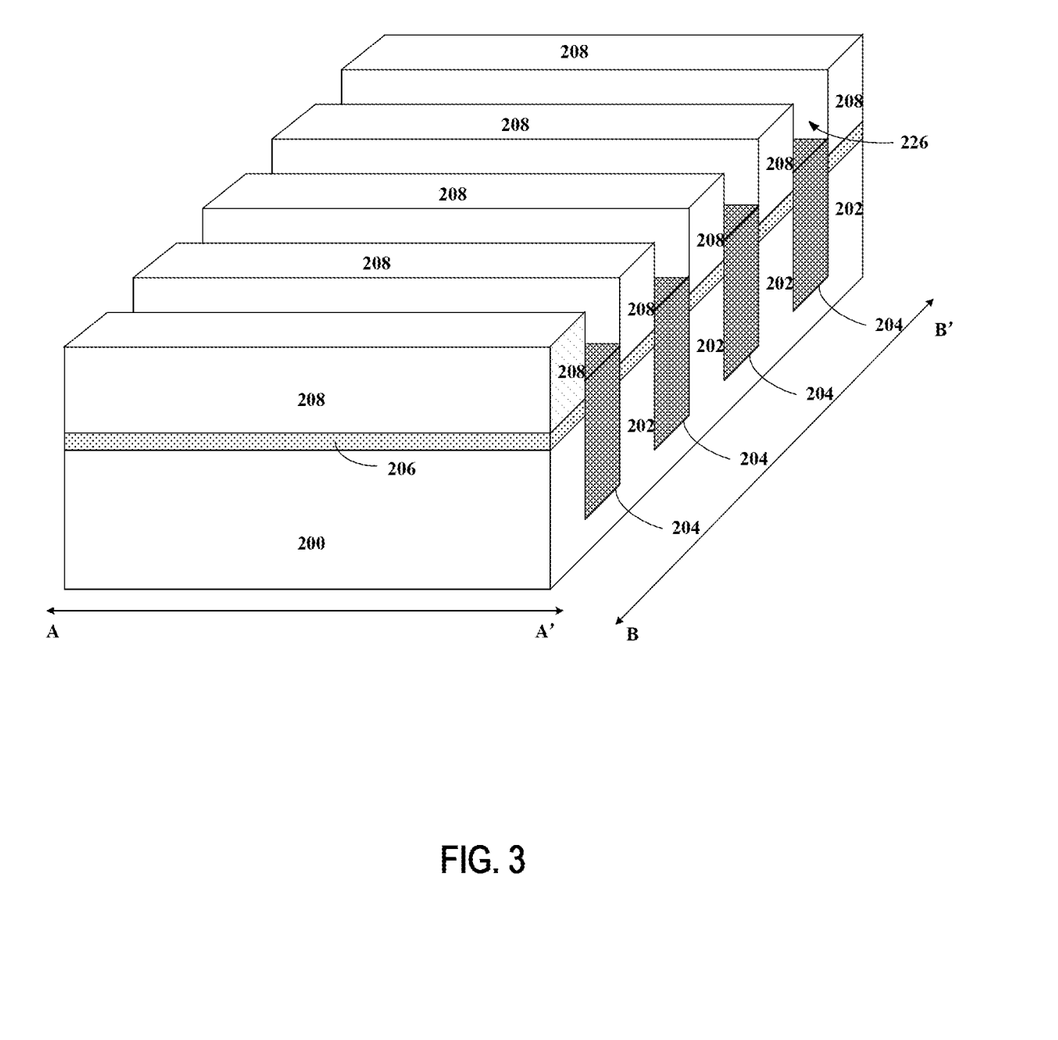

In an embodiment, the substrate structure may be formed as follows. Gate insulating layer 206 is formed on the substrate using a chemical vapor deposition (CVD) process. Next, charge storage layer 208 is formed on gate insulating layer 206. Thereafter, charge storage layer 208, gate insulating layer 206 and the substrate are etched using a patterned mask as a mask (not shown) to form isolation region 204. In a preferred embodiment, as shown in FIG. 3, a fin structure is formed extending in active region 202 along the first direction (along the line AA'), and isolation region 204 is a trench isolation region adjacent the fin structure. In other words, the upper surface of the isolation region is below the upper surface of the adjacent active region, thereby forming a trench 226, as shown in FIG. 3.

Next, gate dielectric layer 210 is formed to block charge transfer (e.g., injection, tunneling, etc.) between the charge storage layer (which later will form a charge storage unit) and gate electrode layer 212, which is described below. Gate dielectric layer is formed on the bottom and sidewalls of trench 226.

Next, gate electrode layer 212 is formed on gate dielectric layer 210. In the embodiment, gate electrode layer 212 is formed on gate dielectric layer 210 and completely fills trench 226, as shown in FIG. 2.

It is to be understood that the active region, the gate insulating layer, the gate dielectric layer, the gate electrode layer, the trench or the isolation region can be formed using conventional deposition and etch techniques known in the art, and will thus not be described in detail herein for the sake of brevity. Those skilled in the art will appreciate that the upper surface of isolation region 204 may be flush with the upper surface of gate insulating layer 206, or the upper surface of isolation region 204 may be slightly above the upper surface of gate insulating layer 206 in the resulting structure, as shown in FIG. 2.

In some embodiments, the active region may also include a peripheral region. The peripheral region may include, but is not limited to, switching devices of a memory cell or a string of memory cells (not shown). In such a case, an opening 214 may be formed in the peripheral region, where opening 214 is formed extending through gate electrode layer 212 and gate dielectric layer 210 and into charge storage layer 208. It is understood that, in the embodiment, the charge storage layer is used to form a floating gate.

Figure 7:
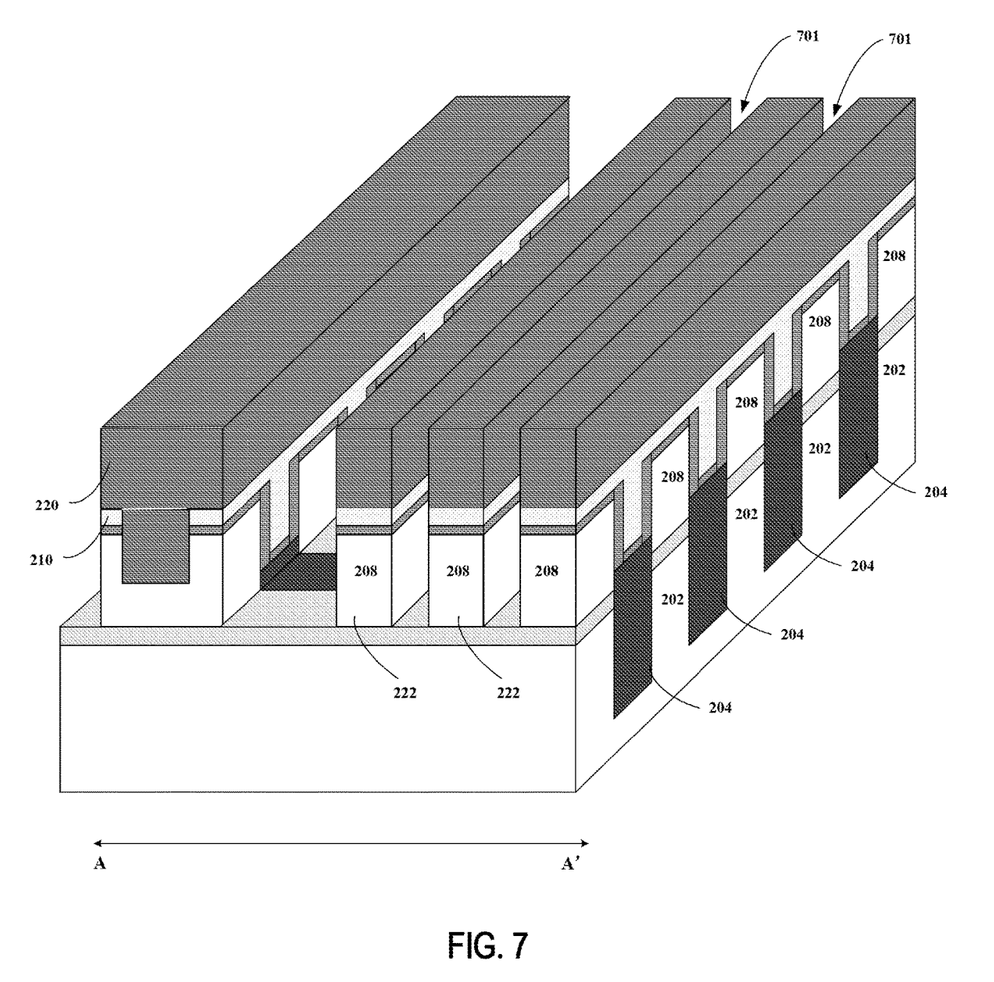

In certain embodiment, a portion of the active region used for a peripheral device and a portion of the active region used for a corresponding memory cell can be in a same fin, as shown in FIGS. 2 and 7. The detail of which will be described further below.

Figure 6:
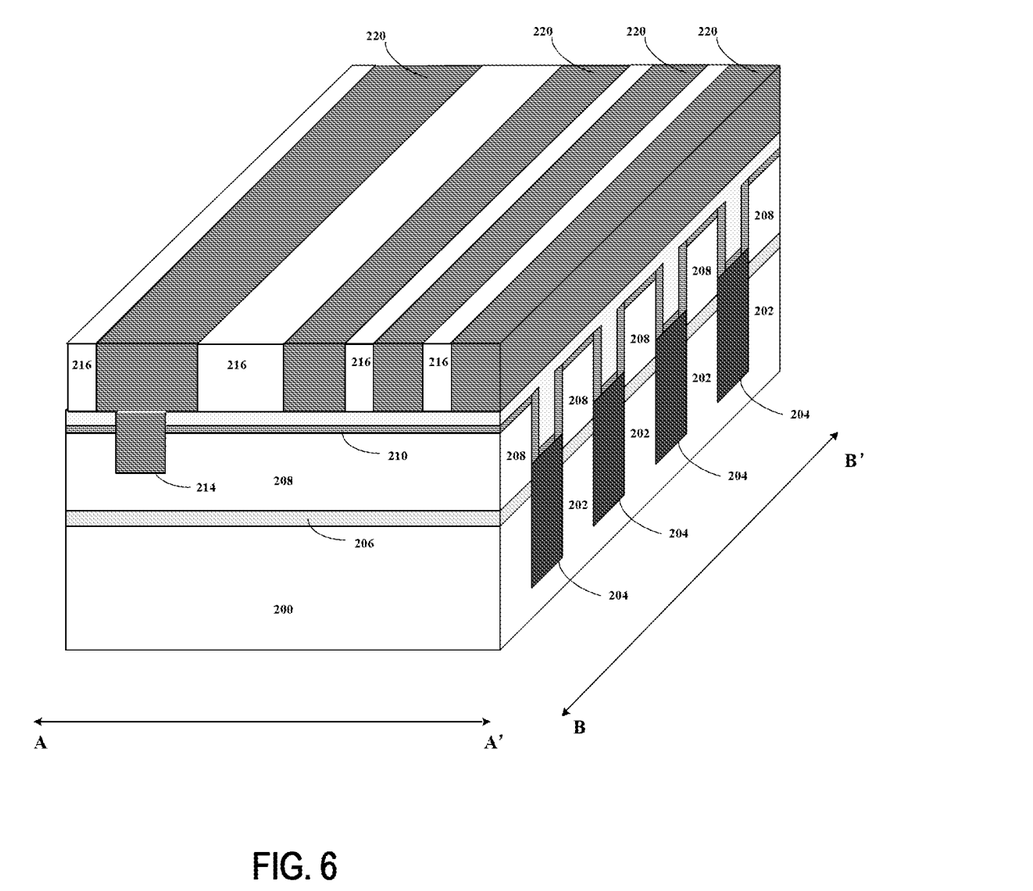

Referring back to FIG. 1, a patterned metal gate layer is formed on the substrate structure in block 102. As shown in FIG. 6, the patterned metal gate layer may include multiple gate lines 220 that are separated from each other along the first direction (along the line AA') and extending along a second direction different from the first direction.

Figure 4:
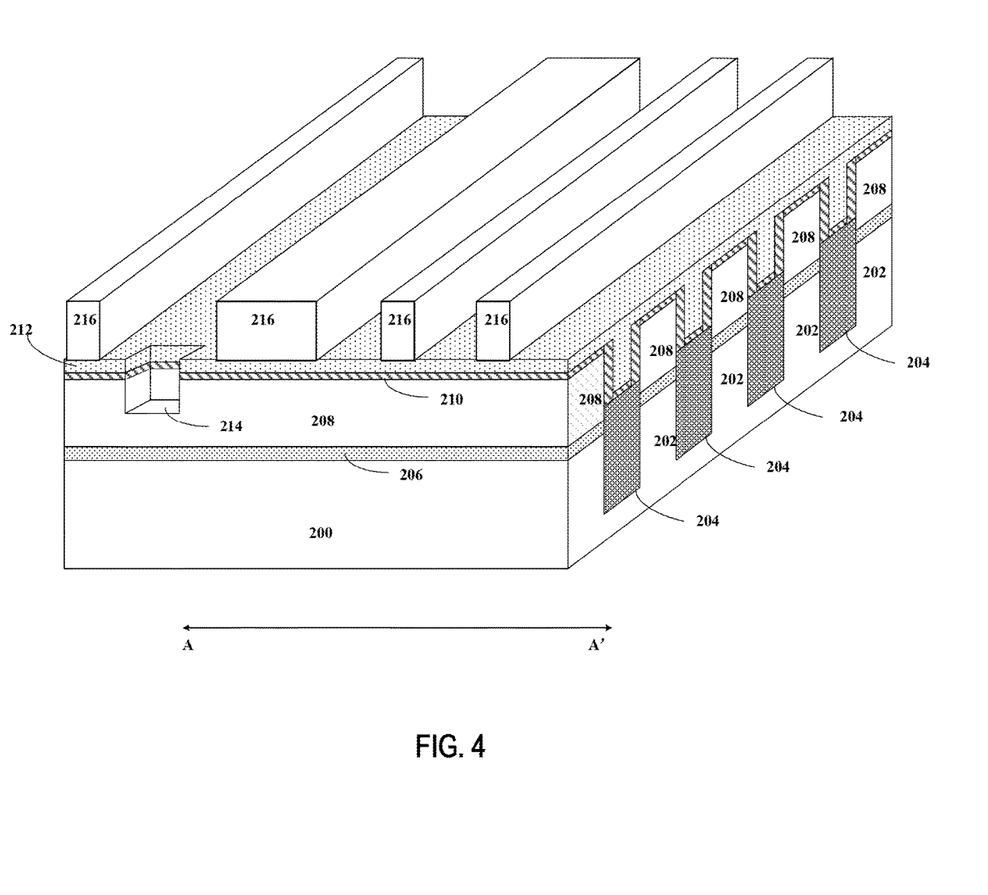

In an embodiment, the patterned metal layer may be formed using the following process steps: A patterned hardmask layer 216 is formed on gate electrode layer 212, as shown in FIG. 4. Patterned hardmask layer 216 includes at least a pattern corresponding to the gate lines that will be formed on the substrate structure. Patterned hardmask layer 216 exposes opening 214 in the peripheral region.

Figure 5:
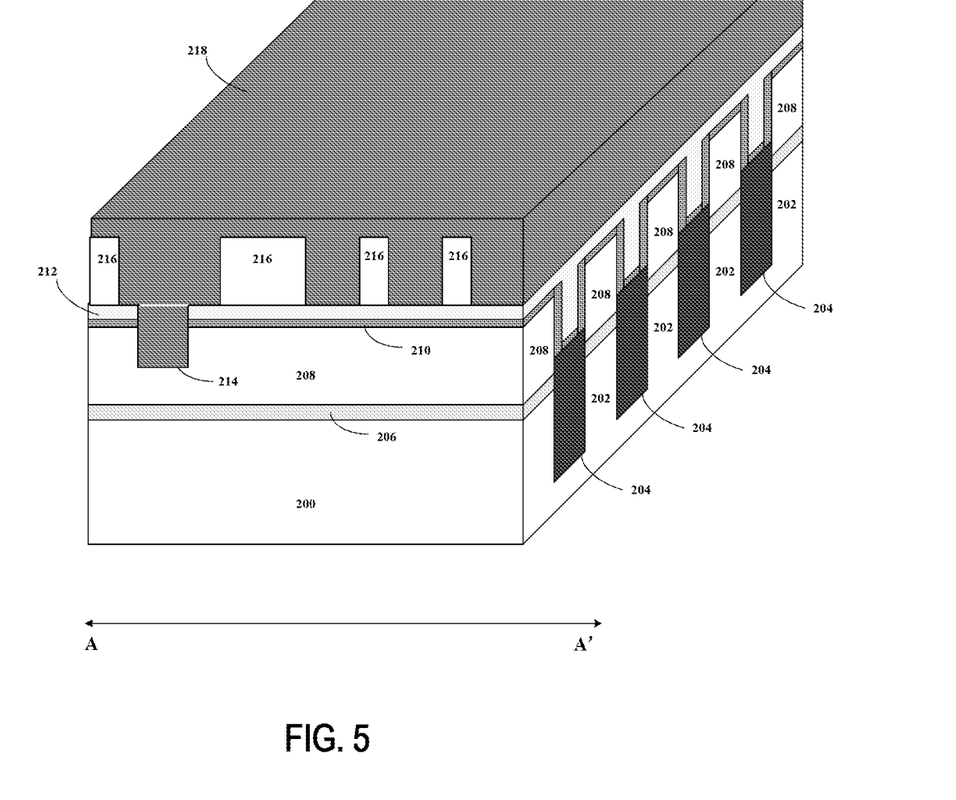

Next, referring to FIG. 5, a metal gate layer 218 is formed on patterned hardmask layer 216. As shown in FIG. 5, metal gate layer 218 is in physical and electrical contact with gate electrode layer 212 and with charge storage layer 208 through opening 214. Metal gate layer 218 may be made of one or more of tungsten, titanium, nickel, palladium, platinum, rhodium, thallium, an alloy thereof, or a metal silicide thereof. Preferably, the metal gate layer may include tungsten that has a good gap filling property.

In a specific embodiment, prior to forming the metal gate layer, an adhesive layer (not shown) may be formed on gate electrode layer 212 to improve the bond between metal gate layer 218 and gate electrode layer 212. The adhesive layer may be a metal nitride, such as titanium nitride, or any suitable material known in the art.

Thereafter, referring to FIG. 6, a planarization process, e.g., a chemical mechanical polish (CMP) process is performed on metal gate layer 218 so that the upper surface of the metal gate layer is flush (coplanar) with the upper surface of hardmask layer 216 to form one or more metal gate lines (alternatively referred to as "gate line" or "gate wire") 220. In an embodiment, a wet cleaning process is performed to remove undesirable metal residues on the planarized (patterned) metal gate layer. Those skilled in the art will appreciate that the term "flush" or "coplanar" used herein is intended to mean that the upper (top) surface of the metal gate layer is substantially flush or coplanar (very close within the process variations) with the upper (top) surface of the hardmask layer.

In an alternative embodiment, hardmask layer 216 may be removed. It is understood that the patterned metal gate layer can be formed using a process different from the above-described process.

Next, referring back to FIG. 1, the gate electrode layer is etched using the patterned metal gate layer as a mask to form a plurality of gate structures that are separated from each other by a space in the first direction in block 103.

Referring to FIG. 7, an etch process is performed on gate electrode layer 212, gate dielectric layer 210 and charge storage layer 208 using patterned metal gate layer 220 as a mask to form a plurality of gate stack structures 222 that are separated from each other by a space 701 in the first direction. Each of the gate stack structures includes a portion of charge storage layer 208 over the gate insulating layer 206, a portion of gate dielectric layer 210 over the portion of charge storage layer 208, a portion of gate electrode layer 212 over the portion of gate dielectric layer 210, and a portion of patterned metal layer 220 (i.e., one of the gate lines) over the portion of gate electrode layer 212.

As shown in FIG. 6, patterned metal gate layer 220 includes multiple gate lines extending along the second direction (line BB') that is different from the first direction (line AA'). An etch process is performed using the patterned metal gate layer 220 as a mask to form the gate stack structures 222 that are separated from each other by a distance along the first direction, as shown in FIG. 7. That is, gate stack structures 222 are separated from each other by a space 701 along the first direction. It is noted that the distance between adjacent gate stack structures may be the same or different. For example, the distance (i.e., space 701) between a gate stack structure in the peripheral region (the left most structure with opening in FIG. 7) and the adjacent gate stack structure is larger than the distance (space 701) between two adjacent (right most) gate stack structures.

In an embodiment, charge storage units 208 of each of gate stack structures 222 may include polysilicon (e.g., doped polycrystalline silicon) to form a floating gate, gate insulating layer 206 below the charge storage units 208 (the floating gate) is a tunnel insulating layer, gate electrode 212 and the corresponding metal gate line together form a control gate.

In another embodiment, charge storage units 208 of gate stack structures 222 may include a silicon oxide-silicon nitride-silicon oxide (ONO) layer, so that gate electrode 212 and the corresponding metal gate line (a portion of patterned metal layer 220) together form the control gate.

In an embodiment, the peripheral device (shown as the device associated with the opening) and the associated memory cells are located in a same fin (shown as the left most fin in FIG. 7). Those skilled in the art will appreciate that the peripheral device and the associated memory cells may be located in different fins.

Referring back to FIG. 1, in block 104, an interlayer dielectric layer is formed on the top surface of the plurality of gate stack structures using a deposition process. Here, the deposition process has a poor step coverage so that an air gap is formed in the space that separates the gate stack structures 208. It is understood that the term "air gap" has a meaning different from the term "void". A void refers to a defect in a semiconductor process that is caused, for example, by a discontinuous coverage of a trench or recess by a deposition process. A material may not be perfectly formed in a trench causing the formation of voids. In contrast, the term "air gap" used herein means that a material is intentionally not formed in the trench. In other words, the term "void" means that a material may be partially formed on the bottom or sidewalls of a trench due to imperfect deposition causing void formation. In contrast, an air gap as used herein is obtained by intentionally not forming any material in the trench so that the trench is free of any material (the bottom and the sidewalls are free of any interlayer dielectric material) in accordance with the present invention. The term "space" refers to a volume defined between two adjacent gate stack structures. For example, when there is no material deposition in the space, then the air gap takes on the volume of the space.

Figure 8:
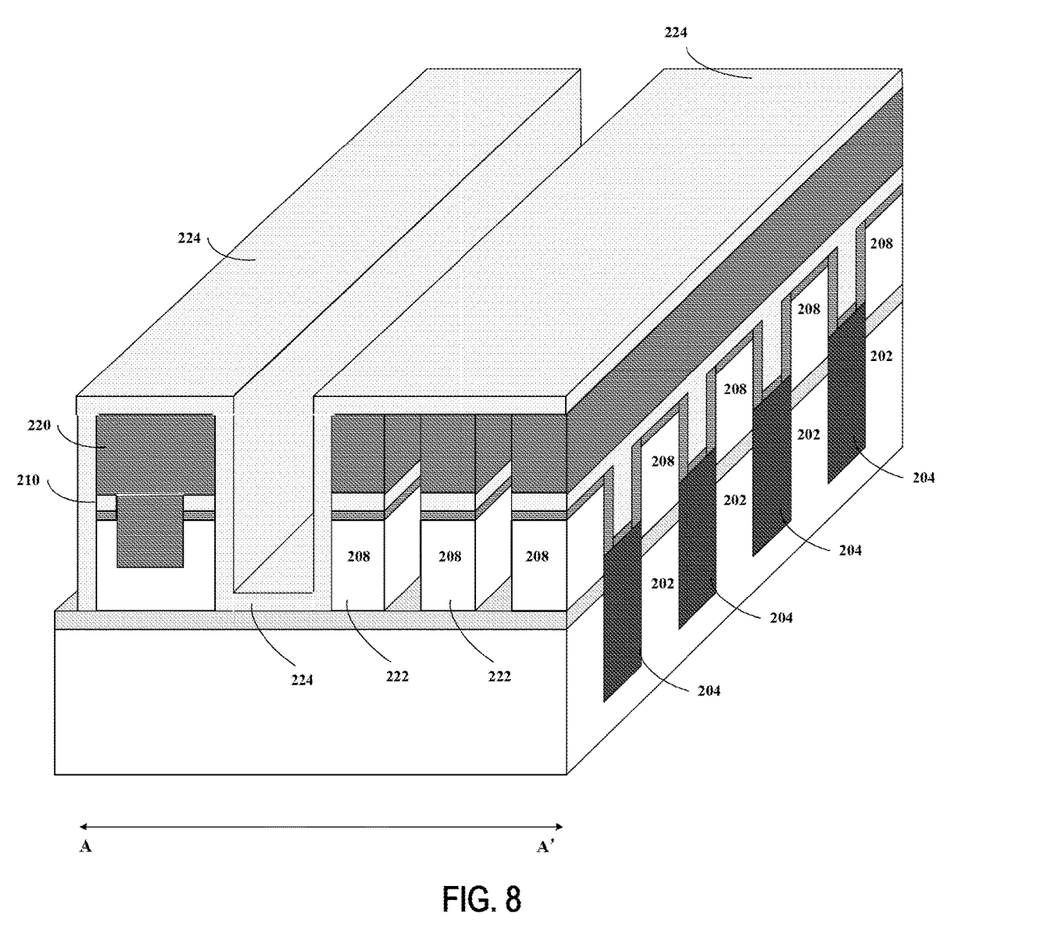

Referring to FIG. 8, an interlayer dielectric layer 224 is formed on the top (upper) surface of the plurality of gate stack structures 222. Interlayer dielectric layer 224 has a poor step coverage so that an air gap is formed in the space between the gate stack structures. For example, a poor step coverage material such as silicon dioxide may be used as the interlayer dielectric layer 224 to form the interlayer dielectric layer on the gate stack structures using a plasma enhanced chemical vapor deposition (PECVD) process. The present inventor discovered that, when the interlayer dielectric layer has a thickness in the range between 50 nm and 800 nm, the interlayer dielectric layer will not fill the space between the gate stack structures for certain sizes of the space.

Referring to FIG. 8, interlayer dielectric layer 224 stretches over space 701 disposed between gate stack structures 222. In the current mainstream technology nodes and future technology nodes, the poor step coverage of the deposition process may only form an interlayer dielectric layer covering the top portion of the space between two adjacent gate stack structures, but not on the bottom and sidewalls of the trench, thereby forming air gap in the trench. The presence of the air gap in the trench (space) between the gate stack structures reduces the coupling or fringe capacitance between adjacent gate stack structures and between the gate stack structure and adjacent gate lines.

In general, the peripheral device is disposed away from the memory cells, the trench width (distance) between the peripheral device and the memory cells is relatively large, so that the interlayer dielectric layer may be formed on the sidewalls of the trench between the peripheral device and the adjacent gate stack structure. Thus, there is no air gap formed in the trench (space) between the peripheral device and the gate stack structure of a memory cell.

Embodiments of the present invention also provide a semiconductor device comprising a semiconductor substrate. The semiconductor substrate includes an active region extending in a first direction and an adjacent isolation region. The semiconductor device also includes a gate insulating layer on the active region, a patterned metal gate layer on the gate insulating layer and having a plurality of metal gates lines extending in a second direction different from the first direction, and a plurality of gate stack structures separated from each other by a space in the first direction. The semiconductor device further includes a charge storage unit in each of the gate stack structures, a portion of a gate dielectric layer on the charge storage unit, a portion of a gate electrode layer on the portion of the gate dielectric layer, and a metal gate on the portion of the gate electrode layer. The metal gate is a respective portion of the metal gate lines. In addition, the semiconductor device includes an interlayer dielectric layer on the top surface of the gate structures covering the top surface of the gate structures but not the bottom and sidewalls of the gate structures, so that an air gap is formed in the space formed between the gate stack structures.

In an embodiment, the interlayer dielectric layer has a thickness in the range between 50 nm and 800 nm.

In one embodiment, the active region includes multiple fins disposed along the first direction, and the adjacent isolation region includes a trench isolation region.

In one embodiment, the semiconductor device may include an adhesive layer disposed between the gate electrode layer and the metal gate layer and configured to improve the bonding strength between the metal gate layer and the gate electrode layer.

In one embodiment, the upper surface of the isolation region is lower than the upper surface of the active region, so a trench is formed between the gate stack structures. The gate dielectric layer is formed on the bottom and sidewalls of the trench, and the gate electrode layer is formed on the gate dielectric layer and completely fills the trench, as shown in FIG. 8

In one embodiment, the metal gate line may be one or more of tungsten, titanium, nickel, palladium, platinum, rhodium, thallium, an alloy thereof, or a metal silicide thereof.

In one embodiment, the semiconductor device may further include a peripheral device, the active region further includes a peripheral region having the peripheral device and an opening in the peripheral region that extends through the gate electrode layer, through the gate dielectric layer and into the charge storage layer. The patterned metal gate layer is in electrical contact with the gate electrode layer and in electrical contact with the charge storage layer through the opening.

In one embodiment, the active region includes one or more fins disposed in the first direction, the isolation region adjacent the active region is a trench isolation region. The peripheral region for a peripheral device and the region in the active region of the corresponding charge storage unit are located in the same fin.

In some embodiments, the charge storage unit is a floating gate, the portion of the gate electrode layer on the portion of the gate dielectric layer is a control gate, the gate insulating layer disposed below the charge storage unit is a tunnel insulating layer. In other embodiments, the charge storage unit includes a silicon oxide-silicon nitride-silicon oxide layer, the portion of the gate electrode layer disposed on the portion of the gate dielectric layer and the corresponding metal gate line together form a control gate, and the gate insulating layer disposed below the charge storage unit is a tunnel insulating layer.

Thus, embodiments of the present invention provide a semiconductor device and method for manufacturing the same. The thus formed semiconductor device has an air gap disposed between the gate stack structures, so that the coupling and fringe capacitance between the gate stack structure and adjacent gate lines is reduced to improve the performance of the semiconductor device.

While the present invention is described herein with reference to illustrative embodiments, this description is not intended to be construed in a limiting sense. Rather, the purpose of the illustrative embodiments is to make the spirit of the present invention be better understood by those skilled in the art. In order not to obscure the scope of the invention, many details of well-known processes and manufacturing techniques are omitted. Various modifications of the illustrative embodiments as well as other embodiments will be apparent to those of skill in the art upon reference to the description. For example, although only one peripheral region and four trenches are shown, it is understood that the number of trenches and peripheral regions can be more than four in other embodiments. It is therefore intended that the appended claims encompass any such modifications.

Furthermore, some of the features of the preferred embodiments of the present invention could be used to advantage without the corresponding use of other features.

As such, the foregoing description should be considered as merely illustrative of the principles of the invention, and not in limitation thereof.

What is claimed is:

1. A semiconductor device comprising:
   a semiconductor substrate including an active region extending along a first direction and an adjacent isolation region;
   a gate insulating layer on the active region;
   a patterned metal gate layer comprising a plurality of metal gate lines extending along a second direction different from the first direction;
   a plurality of gate structures separated from each other by a space in the first direction, each of the gate structures comprising a charge storage unit on the gate insulating layer, a first portion of a gate dielectric layer on the charge storage unit, a first portion of a gate layer on the first portion of the gate dielectric layer, and a metal gate on the first portion of the gate layer, the metal gate being a portion of a corresponding metal gate line;
   an interlayer dielectric layer on an upper surface of the gate structures stretching over the space while forming an air gap in the space, the interlayer dielectric layer not formed on sidewalls and a bottom between two adjacent gate structures; and
   a peripheral region including a peripheral device on the active region, the peripheral device being spaced apart from the plurality of gate structures by a second space, wherein the interlayer dielectric layer is directly disposed on sidewalls and a bottom of the second space between the peripheral device and an adjacent gate structure and does not bridge over the second space, wherein the interlayer dielectric layer is not disposed on sidewalls of two adjacent charge storage layers.

2. The semiconductor device of claim 1, wherein the interlayer dielectric layer has a thickness in a range between 50 nm and 800 nm.

3. The semiconductor device of claim 1, wherein the active region comprises a plurality of fins extending along the first direction, and the adjacent isolation region is a trench isolation region.

4. The semiconductor device of claim 1, wherein the active region comprises a plurality of fins extending along the first direction, the adjacent isolation region is a trench isolation region having an upper surface lower than an upper surface of the active region forming a trench, the gate dielectric layer is formed on a bottom and sidewalls of the trench, and the gate layer is disposed on the gate dielectric layer filling the trench.

5. The semiconductor device of claim 1, wherein the patterned metal gate layer comprises one or more of tungsten, titanium, nickel, palladium, platinum, rhodium, thallium, an alloy thereof, or a metal silicide thereof.

6. The semiconductor device of claim 1, wherein the peripheral device comprises:
   a second gate structure, the second gate structure comprising:
   an opening in the peripheral region and extending through a second portion of the gate layer, a second portion of the gate dielectric layer, and into a portion of a second charge storage unit,
   a second metal gate in electrical contact with the second portion of the gate layer and in electrical contact with the second charge storage unit through the opening,
   wherein the interlayer dielectric layer is on an upper surface and opposite sidewalls of the second gate structure.

7. The semiconductor device of claim 6, wherein the active region further comprises a plurality of fins extending along the first direction, the adjacent isolation region is a trench isolation region, and the peripheral device in the peripheral region and a corresponding memory cell in the active region are located in a same fin.

8. The semiconductor device of claim 1, wherein the charge storage unit is a floating gate, the first portion of the gate layer is a control gate, the gate insulating layer below the floating gate is a tunnel insulating layer.

9. The semiconductor device of claim 1, wherein the charge storage unit comprises a silicon oxide-silicon nitride-silicon oxide layer stack, the first portion of the gate layer and a corresponding metal gate line together form a control gate, and the gate insulating layer below the charge storage unit is a tunnel insulating layer.

10. The semiconductor device of claim 1, further comprising an adhesive layer disposed between the patterned metal gate layer and the gate layer, wherein the adhesive layer comprises titanium nitride.

* * * * *